United States Patent
Watanabe et al.

(10) Patent No.: US 6,577,213 B2
(45) Date of Patent: Jun. 10, 2003

(54) METHOD AND APPARATUS FOR MULTIPLYING A FREQUENCY OF AN ELECTROMAGNETIC WAVE

(75) Inventors: Hideki Watanabe, Ebetsu (JP); Makoto Sawamura, Sapporo (JP); Kazuhisa Sueoka, Sapporo (JP); Koichi Mukasa, Sapporo (JP); Ryosho Nakane, Sapporo (JP)

(73) Assignee: Hokkaido University, Sapporo (JP)

( * ) Notice: Subject to any disclaimer, the term of this patent is extended or adjusted under 35 U.S.C. 154(b) by 0 days.

(21) Appl. No.: 10/055,030

(22) Filed: Jan. 22, 2002

(65) Prior Publication Data
US 2002/0135443 A1 Sep. 26, 2002

(30) Foreign Application Priority Data
Jan. 22, 2001 (JP) .......................... 2001-012644

(51) Int. Cl.⁷ .............. H01P 1/00; H03B 19/00
(52) U.S. Cl. .......... 333/218; 327/116; 327/119; 327/122
(58) Field of Search .......... 333/218; 327/116, 327/119, 122

(56) References Cited

U.S. PATENT DOCUMENTS

| 4,527,137 A | * | 7/1985 | Hartley | 333/137 |
| 5,731,752 A | * | 3/1998 | Wood | 333/218 |
| 6,297,716 B1 | * | 10/2001 | Wood | 333/218 |

* cited by examiner

Primary Examiner—Barbara Summons
(74) Attorney, Agent, or Firm—Stoel Rives LLP

(57) ABSTRACT

A ferromagnetic film, which has an inherent resonant frequency, is disposed in a cavity resonator. An electromagnetic wave, which has an input frequency equal to the resonant frequency of the ferromagnetic film, is introduced to the ferromagnetic film from an orifice of the cavity resonator to generate a ferromagnetic resonance in the ferromagnetic film, and thus, multiply the input frequency of the electromagnetic wave.

15 Claims, 1 Drawing Sheet

METHOD AND APPARATUS FOR MULTIPLYING A FREQUENCY OF AN ELECTROMAGNETIC WAVE

BACKGROUND OF THE INVENTION

1. Field of the Invention

This invention relates to a method and apparatus for multiplying a frequency of an input electromagnetic wave and, in particular, to such a method and an apparatus that are usable for microwave and high frequency fields, which often require the frequency multiplication in a mobile communication device or a cellular information instrument.

2. Description of the Prior Art

A frequency generated at and transmitted from a mobile communication device or a cellular information instrument can be multiplied by taking advantage of the non-linear resistance performance of a crystal detector. In this case, however, since many elements must be controlled and matched, the operation becomes complicated.

On the other hand, a monolithic microwave integrated circuit can be employed in which a given microwave circuit is fabricated, as a high speed and high frequency circuit, on a single substrate. Since it can be reliably mass produced, the monolithic microwave integrated circuit is preferably employed for commercial use. However, it is desired that the monolithic integrated circuit operate at a higher frequency, be of low cost, be susceptible to miniaturization and weight reduction, and consumer low amounts of electric power.

SUMMARY OF THE INVENTION

It is an object of the present invention to provide a new method for multiplying a frequency and an instrument for implementing the method.

For achieving the above object, this invention relates to a method for multiplying a frequency, comprising the steps of providing a ferromagnetic film, which has an inherent resonant frequency, and introducing an electromagnetic wave, which has an input frequency equal to the resonant frequency of the ferromagnetic film. Introducing the electromagnetic wave generates a ferromagnetic resonance in the ferromagnetic film and thus, multiplies the input frequency of the introduced electromagnetic wave.

The present invention takes advantage of the ferromagnetic resonance of a ferromagnetic film, as described further below.

FIG. 1 is a diagram that is useful for explaining the principles according to the present invention. In the ferromagnetic resonance of a ferromagnetic film, the magnetic moment M is affected by a diamagnetic field, which is generated in the direction perpendicular to the main surface of a ferromagnetic film. Thus the magnetic moment M has a large amplitude in the direction parallel to the main surface and a small amplitude in the direction perpendicular to the main surface. In this case, the magnetic moment M oscillates twice in a Z direction while oscillating once in a X direction, as shown in FIG. 1. Therefore, if a ferromagnetic resonance is generated at a resonant frequency of f, the magnetic moment M oscillates f times in the X direction and 2f times in the Z direction.

If an electromagnetic wave having almost the same input frequency as the resonant frequency f is introduced into the ferromagnetic film, a ferromagnetic resonance is generated as described above. As explained above, the magnetic moment M oscillates in a frequency of 2f in the Z direction and radiates an electromagnetic wave having a frequency of 2f. As a result, the input frequency of the introduced electromagnetic wave doubled. The frequency of a given electromagnetic wave can be multiplied by using the ferromagnetic resonance of a ferromagnetic film.

The resonant frequency of a ferromagnetic film can be adjusted as appropriate for a particular use by appropriately adjusting the type of the ferromagnetic material, the thickness, and other properties of the film. Therefore, the present invention can effectively multiply the input frequency of an electromagnetic wave for a wide range of input frequencies.

Also, since the dimensions of the ferromagnetic film are in the order of nanometers, the present invention can be miniaturized. Because the ferromagnetic resonance is generated without an external magnetic field, excess electric power is not consumed to generate the magnetic field, resulting in lower power consumption.

In addition, the ferromagnetic film may be made of a Co single crystal film, as discussed below, which is not expensive, and the present invention does not require an additional external magnet. Therefore, the multiplying method and apparatus of the present invention can be inexpensive.

BRIEF DESCRIPTION OF THE DRAWINGS

For better understanding of the present invention, reference is made to the attached drawings, wherein.

DETAILED DESCRIPTION OF PREFERRED EMBODIMENTS

Figure 1:
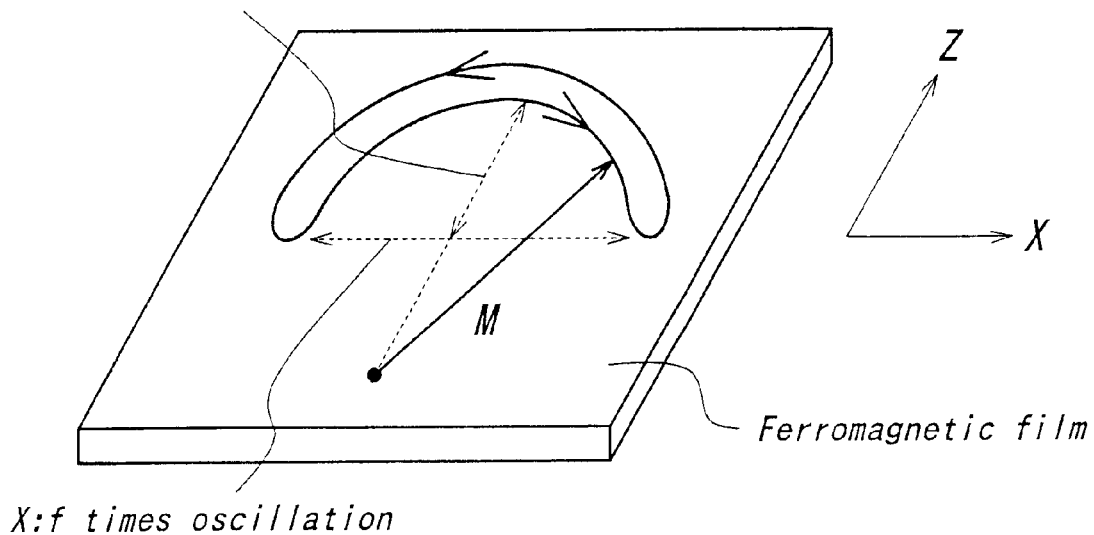
FIG. 1 is a diagram that is useful for explaining the principles of the frequency multiplying method in accordance with the present invention.
Figure 2:
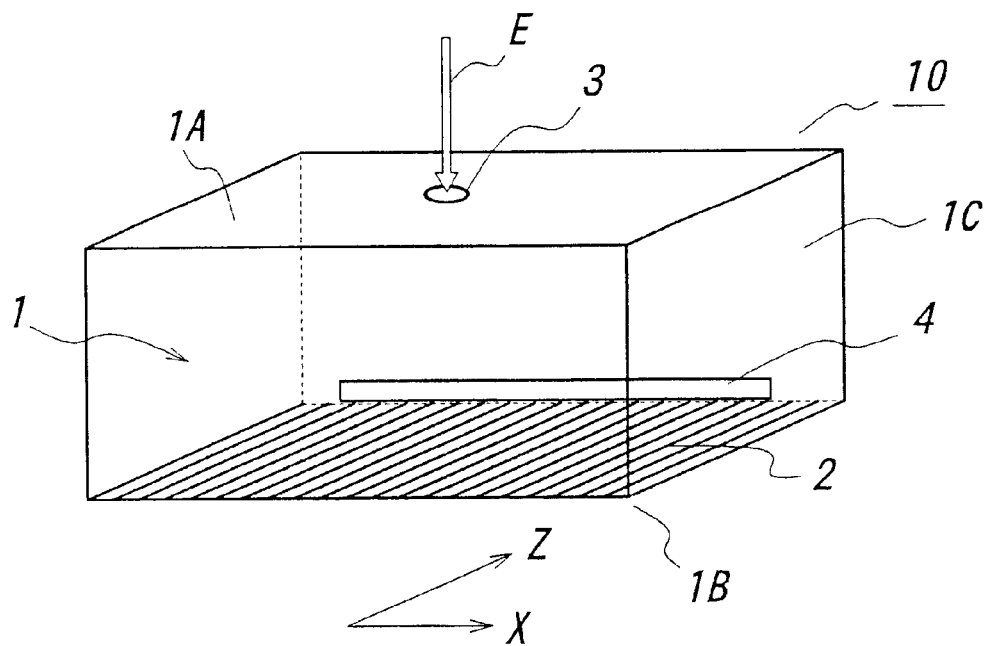
FIG. 2 is a perspective view showing a frequency multiplying apparatus in accordance with the present invention.

This invention will be described in detail with reference to the accompanying drawings. FIG. 2 is a perspective view showing a frequency multiplying apparatus to be used in a frequency multiplying method in accordance with the present invention. A frequency multiplying apparatus 10 shown in FIG. 1 includes a cavity resonator 1 and a ferromagnetic film 2, which has a resonant frequency f, provided on a bottom wall surface 1B inside cavity resonator 1. An orifice 3 is formed in a wall surface 1A of cavity resonator 1 opposite to ferromagnetic film 2, and a slit 4 is formed in a side wall surface 1C of cavity resonator 1.

An electromagnetic wave E having a given input frequency to be multiplied is introduced into cavity resonator 1 from orifice 3. In this case, the input frequency of the wave is set equal to the resonance frequency f of ferromagnetic film 2. As mentioned above, since the resonance frequency f can be varied within a wide range by selecting the ferromagnetic material, the dimension and other properties of the film, frequency multiplying apparatus 10 can work with a wide range of input frequencies of the electromagnetic wave E.

After the introduction into cavity resonator 1, the electromagnetic wave E generates a ferromagnetic resonance in ferromagnetic film 2. In this case, as explained above, with reference to FIG. 1, the magnetic moment oscillates twice in a Z direction while oscillating once in a X direction. Therefore, an electromagnetic wave having a frequency 2f, twice as large as the input frequency of the electromagnetic wave E, is generated and radiated. The electromagnetic wave, having a frequency 2f, can be taken out of slit 4, which has been provided in the Z direction.

In FIG. 2, the X direction and the Z direction are shown for the purpose of describing the present invention. The X and Z directions may, however, be set appropriately in the main surface of ferromagnetic film 2 for a particular use of the film. However, it is required for taking out the multiplied electromagnetic wave that a given slit, such as slit 4, be provided in a newly set Z direction.

In FIG. 2, although only a single ferromagnetic film 2 is provided in cavity resonator 1 to multiply the input frequency of the electromagnetic wave E, a plurality of ferromagnetic films may be provided to multiply the input frequency several times, and thus, generate an electromagnetic wave having a frequency greater than two times the input frequency.

In the situation in which the input wave is multiplied by an amount greater than two times the input frequency, a plurality of ferromagnetic films with respective resonant frequencies of f, 2f, 4f, . . . , 2nf (where n is a natural number) are provided and arranged, in turn, in the same plane. Then, an electromagnetic wave (first electromagnetic wave) having an input frequency equal to the first resonant frequency f is introduced to a first ferromagnetic film having a first resonant frequency f, to generate and radiate an electromagnetic wave (second electromagnetic wave) having the second resonant frequency 2f, which is twice as large as the first resonant frequency f.

The second magnetic wave, having a frequency that is twice the first resonant frequency f, is introduced to the second ferromagnetic film having a second resonant frequency 2f, to generate and radiate an electromagnetic wave (third electromagnetic wave) having the third resonant frequency 4f. By repeating such an operation several times, finally, an electromagnetic wave having a frequency 2nf can be generated and radiated. That is, if a plurality of ferromagnetic films having their respective 2nf times frequencies are arranged in turn, and a given electromagnetic wave having a frequency f is introduced to the ferromagnetic films in turn, from the first ferromagnetic wave film of the first frequency f to the final ferromagnetic film of the final frequency 2nf, the introduced electromagnetic wave is multiplied several times, to provide an electromagnetic wave having a higher frequency.

For example, the plurality of ferromagnetic films may be arranged on the same bottom wall surface 1B of single cavity resonator 1, as shown in FIG. 2. Also, the plurality of ferromagnetic films can be set in their respective cavity resonators, and the cavity resonators can be arranged in turn, corresponding to the amplitudes of the resonance frequencies of the ferromagnetic films.

The ferromagnetic film is made of a material that generates a ferromagnetic resonance. In a preferred embodiment, the ferromagnetic film is made of a well known ferromagnetic material such as Fe, Ni, Co, and alloys of these elements. Particularly, it is desired that the ferromagnetic film be made of a Co single crystal film.

Because it has a face-centered cubic crystal structure, a Co single crystal film has a higher magnetocrystalline anisotropy. Because of this property, a given ferromagnetic resonance can be easily generated therein without an external magnetic field only by introducing an electromagnetic wave having a frequency that is almost equal to the resonant frequency of the Co single crystal film. In this case, since additional external magnet is not needed and thus, excess electric power is not consumed, a low electric power consumption can be realized in the frequency multiplying apparatus and thus, the multiplying method of the present invention. Moreover, since the construction and mechanism of the frequency multiplying apparatus is simplified and a Co single crystal film is not expensive, the multiplying instrument and the multiplying method of the present invention can result in lower cost.

If the ferromagnetic film is made of the Co single crystal film, the thickness is preferably set within 0.5 nm–5 nm, particularly within 1 nm–2 nm. In this case, the magnetic moment can precess in the main surface, and thus, a given ferromagnetic resonance can be easily realized.

The length of the ferromagnetic film is set within 0.5 nm–30 nm, and the width of the ferromagnetic film is set within 0.5 nm–30 nm. Therefore, the multiplying instrument as shown in FIG. 2 can be miniaturized sufficiently.

Although the present invention was described in detail with reference to the above examples, this invention is not limited to the above disclosure and every kind of variation and modification may be made without departing from the scope of the present invention.

What is claimed:

1. A method for multiplying a frequency, comprising the steps of:

providing a ferromagnetic film having a resonant frequency; and providing an electromagnetic wave having an input frequency that is equal to the resonant frequency of the ferromagnetic film, thereby to generate a ferromagnetic resonance in the ferromagnetic film and thus, multiply the input frequency of the electromagnetic wave.

2. A multiplying method as defined in claim 1, wherein the input frequency of the electromagnetic wave is multiplied twice by the ferromagnetic resonance of the ferromagnetic film.

3. A multiplying method according to claim 1, wherein the ferromagnetic film is made of a Co single crystal film.

4. A multiplying method according to claim 3, wherein the ferromagnetic film has a thickness and the thickness of the ferromagnetic film is set within 0.5 nm–5 nm.

5. A method for multiplying a frequency, comprising the steps of:

placing in a cavity resonator a ferromagnetic film having a resonant frequency, the cavity resonator having an orifice;

providing an electromagnetic wave through the orifice of the cavity resonator and into the cavity resonator, the electromagnetic wave having an input frequency that is equal to the resonant frequency of the ferromagnetic film, thereby to generate a ferromagnetic resonance in said ferromagnetic film, and thus, multiply the input frequency of the electromagnetic wave; and removing the electromagnetic wave having the multiplied frequency out of a slit formed in the cavity resonator.

6. A multiplying method according to claim 5, wherein the ferromagnetic film is made of a Co single crystal film.

7. A multiplying method according to claim 6, wherein the ferromagnetic film has a thickness and the thickness of the ferromagnetic film is set within 0.5 nm–5 nm.

8. A method for multiplying a frequency, comprising the steps of:

providing a plurality of ferromagnetic films, each having a resonant frequency and a corresponding amplitude;

providing to one of the ferromagnetic films an electromagnetic wave having an input frequency that is equal to the resonant frequency of the one of the ferromagnetic films, thereby to multiply the input frequency through the ferromagnetic resonance of the one of the ferromagnetic films; and introducing the electromagnetic wave that has the multiplied frequency to another one of the ferromagnetic films positioned adjacent to the one of the ferromagnetic films, thereby to multiply the input frequency of the electromagnetic wave.

9. A multiplying method according to claim 8, wherein the input frequency of the electromagnetic wave is doubled at each of the ferromagnetic films.

10. A multiplying method according to claim 8, wherein each of the ferromagnetic films is made of a Co single crystal film.

11. A multiplying method according to claim 10, wherein each of the ferromagnetic films has a thickness and the thickness of each of the ferromagnetic films is set within 0.5 nm–5 nm.

12. An apparatus for multiplying a frequency of an input electromagnetic wave, comprising:

a cavity resonator including an orifice and a slit, the orifice positioned to introduce into the cavity resonator an input electromagnetic wave having input frequency, and the positioned slit to take the electromagnetic wave out of the cavity resonator; and a ferromagnetic film disposed in the cavity resonator.

13. A multiplying apparatus according to claim 12, wherein the input frequency of the electromagnetic wave is doubled.

14. A multiplying apparatus according to claim 12, wherein the ferromagnetic film is made of a Co single crystal film.

15. A multiplying apparatus according to claim 14, wherein the ferromagnetic film has a thickness, and the thickness of said ferromagnetic film is set within 0.5 nm–5 nm.

* * * * *